(12) United States Patent
Yanagisawa et al.

(10) Patent No.: US 8,437,106 B2
(45) Date of Patent: May 7, 2013

(54) THIN FILM MAGNETIC HEAD INCLUDING SPIN-VALVE FILM WITH FREE LAYER MAGNETICALLY CONNECTED WITH SHIELD

(75) Inventors: Takumi Yanagisawa, Tokyo (JP); Yasushi Nishioka, Tokyo (JP); Takahiko Machita, Tokyo (JP); Satoshi Miura, Tokyo (JP); Takayasu Kanaya, Tokyo (JP); Kenzo Makino, Tokyo (JP); Yoshikazu Sawada, Tokyo (JP); Takekazu Yamane, Tokyo (JP); Naomichi Degawa, Tokyo (JP); Kosuke Tanaka, Tokyo (JP); Soji Koide, Tokyo (JP); Daisuke Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 250 days.

(21) Appl. No.: 12/900,845

(22) Filed: Oct. 8, 2010

(65) Prior Publication Data

US 2012/0087045 A1 Apr. 12, 2012

(51) Int. Cl.
*G11B 5/39* (2006.01)

(52) U.S. Cl.
USPC ..................................... 360/319; 360/324.12

(58) Field of Classification Search .................. 360/319, 360/324–324.2
See application file for complete search history.

(56) References Cited

U.S. PATENT DOCUMENTS

| | | | | |
|---|---|---|---|---|
| 5,838,521 A * | 11/1998 | Ravipati | ......................... | 360/319 |
| 6,769,170 B1 * | 8/2004 | Shimazawa et al. | ....... | 29/603.09 |
| 7,295,401 B2 * | 11/2007 | Jayasekara et al. | ...... | 360/125.08 |
| 7,599,151 B2 * | 10/2009 | Hatatani et al. | ................ | 360/319 |
| 8,014,108 B2 * | 9/2011 | Shimazawa et al. | .......... | 360/319 |
| 8,089,734 B2 * | 1/2012 | Miyauchi et al. | .............. | 360/319 |
| 8,203,809 B2 * | 6/2012 | Zhou et al. | ................ | 360/324.12 |
| 2004/0156148 A1 | 8/2004 | Chang et al. | | |
| 2005/0157431 A1 * | 7/2005 | Hatatani et al. | ................ | 360/319 |
| 2005/0264948 A1 | 12/2005 | Nakamoto et al. | | |
| 2006/0098334 A1 * | 5/2006 | Jayasekara et al. | ........... | 360/125 |
| 2011/0051291 A1 * | 3/2011 | Miyauchi et al. | .......... | 360/245.3 |
| 2011/0279923 A1 * | 11/2011 | Miyauchi et al. | ................ | 360/75 |
| 2012/0147504 A1 * | 6/2012 | Zhou et al. | ................ | 360/324.12 |

FOREIGN PATENT DOCUMENTS

| | | | | |
|---|---|---|---|---|
| JP | 06084144 A | * | 3/1994 | |
| JP | A-2004-178656 | | 6/2004 | |
| JP | 2004259330 A | * | 9/2004 | |
| JP | A-2005-203063 | | 7/2005 | |
| JP | A-2005-353666 | | 12/2005 | |
| JP | 2007173506 A | * | 7/2007 | |
| JP | 2010102817 A | * | 5/2010 | |

* cited by examiner

OTHER PUBLICATIONS

U.S. Appl. No. 12/900,879, filed Oct. 8, 2010, Yanagisawa et al.

*Primary Examiner* — Will J Klimowicz
(74) *Attorney, Agent, or Firm* — Posz Law Group, PLC (57) ABSTRACT

A thin film magnetic head includes; an MR film that includes a pinned layer of which a magnetization direction is pinned, a free layer of which a magnetization direction varies, and a spacer that is disposed therebetween; a pair of shields that are disposed on both sides sandwiching the MR film in a direction orthogonal to a film surface of the MR film; and an anisotropy providing layer that provides anisotropy to a first shield so that the first shield is magnetized in a desired direction, and that is disposed on an opposite side from the MR film with respect to the first shield. The MR film includes a magnetic coupling layer that is disposed between the first shield and the free layer and that magnetically couples the first shield with the free layer.

19 Claims, 8 Drawing Sheets

THIN FILM MAGNETIC HEAD INCLUDING SPIN-VALVE FILM WITH FREE LAYER MAGNETICALLY CONNECTED WITH SHIELD

CROSS REFERENCE TO RELATED APPLICATION

This application is related to U.S. patent application Ser. No. 12/900,897, entitled "THIN FILM MAGNETIC HEAD INCLUDING SOFT LAYER MAGNETICALLY CONNECTED WITH SHIELD," filed simultaneously on Oct. 8, 2010 with the present application.

TECHNICAL FIELD

The present invention relates to a spin-valve type thin film magnetic head, and particularly to a configuration for applying bias to a free layer of a magneto resistance effect film.

BACKGROUND

As a reading element of a thin film magnetic head, a magneto resistance (MR) element made with a multilayer film has been known. Conventionally, a current in plane (CIP) element, in which a sense current flows in a direction in plane with a film surface, has been primarily utilized. Recently, in order to enable a further high density recording, a current perpendicular to the plane (CPP) element, in which a sense current flows in a direction orthogonal to a film surface, has been developed. As elements of this type, a tunnel magneto-resistance (TMR) element in which a TMR effect is utilized and a current perpendicular to the plane-giant magneto resistance (CPP-GMR) element in which a GMR effect is utilized have been known.

As an example of the GMR element or the TMR element, there is an element including a spin valve film (hereafter, referred to as SV film). The SV film includes a pinned layer where a magnetization direction is pinned with respect to an external magnetic field, a free layer where a magnetization direction is changed with respect to the external magnetic field, and a spacer sandwiched by the pinned layer and the free layer. The SV film is sandwiched by a pair of shields that are electrodes for supplying the sense current.

In accompaniment with a recording density improvement of a recent magnetic recording medium, the thin film magnetic head has a so-called side reading problem in that magnetic information leaked from adjacent tracks is also read. In order to cope with the side reading problem, JP 2005-203063A discloses a thin film magnetic head in which soft magnetic layers are disposed on both sides of a MR element in a track width direction. In the specification, the track width direction indicates a direction parallel to a track width direction of a recording medium when a slider including the MR element faces the recording medium. Since a soft magnetic material absorbs a magnetic flux from the adjacent track, the effect of noise due to the magnetic flux from the adjacent track is suppressed. As a result, it is thought that the thin film magnetic head corresponding to a recording medium of high recording density is provided.

In the thin film magnetic head disclosed in JP2005-203063A, a domain control layer is formed in a SV film in order to form a free layer in a single domain structure. The domain control layer is configured with a non-magnetic separate layer, a longitudinal bias layer, and an antiferromagnetic layer. Or, the domain control layer may be configured with a non-magnetic separate layer and a hard magnetic layer or the like. The domain control layer applies a bias magnetic field to the free layer to form the single domain free layer. Such a single domain free layer has advantages in view of improving linearity of resistance variation corresponding to an external magnetic field variation, and of simultaneously suppressing Barkhausen noise. A magnetization direction of the biased magnetic layer is pinned in the track width direction.

However, in JP2005-203063A, a gap between a pair of shields is increased only by an amount of the thickness of the antiferromagnetic layer or the hard magnetic layer of the domain control layer. Particularly, the antiferromagnetic layer or the hard magnetic layer for generating exchange anisotropy is required to have sufficient thickness. When the gap between the shields is large, a magnetic field from an adjacent bit is likely to be read so that high frequency characteristics of the thin film magnetic head may be deteriorated. When a thickness of the antiferromagnetic layer or the hard magnetic layer is thinned, sufficient bias magnetic field may not be applied to the free layer. Particularly, the antiferromagnetic layer may need to have a film thickness of 6 nm or more.

Therefore, a thin film magnetic head is desired in which the gap between the shields (in other words, a height of the SV film) is suppressed, and in which a sufficient bias is applied to the free layer.

SUMMARY

A thin film magnetic head includes; a magneto resistance effect (MR) film that includes a pinned layer of which a magnetization direction is pinned with respect to an external magnetic field, a free layer of which a magnetization direction varies corresponding to the external magnetic field, and a spacer that is disposed between the pinned layer and the free layer; a pair of shields that are disposed on both sides in a manner of sandwiching the MR film in a direction orthogonal to a film surface of the MR film; and an anisotropy providing layer that provides anisotropy to a first shield, which is disposed on a free layer side of the pair of the shields, so that the first shield is magnetized in a desired direction, and that is disposed on an opposite side from the MR film with respect to the first shield, wherein the MR film includes a magnetic coupling layer that is disposed between the first shield and the free layer and that magnetically couples the first shield with the free layer.

The anisotropy providing layer is preferably configured with an antiferromagnetic layer or a hard magnetic layer. The anisotropy providing layer provides exchange anisotropy to the first shield and magnetizes the first shield in the desired direction. The magnetic coupling layer magnetically couples the first shield with the free layer. As described above, the first shield applies bias to the free layer via the anisotropy providing layer.

In the above-described thin film magnetic head, the anisotropy providing layer that provides the exchange anisotropy to the first shield is disposed on an outer side of the pair of the shields. As the result, a gap between the pair of the shields is decreased by a thickness of the anisotropy providing layer.

The above mentioned object, features, and advantages of the present invention and other objects, features, and advantages will be disclosed by the following descriptions referring to the figures illustrating embodiments of the present invention.

DETAILED DESCRIPTION OF THE INVENTION

Hereafter, one embodiment of the present invention will be explained referring to the figures.

Figure 1:
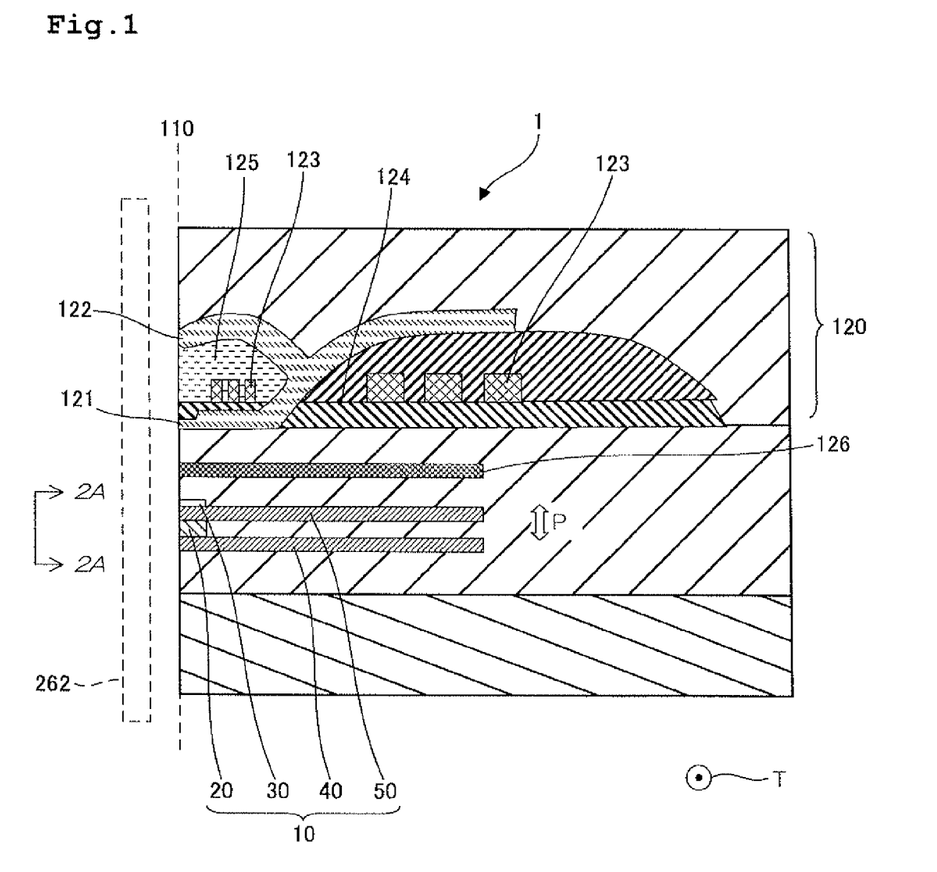
FIG. 1 is a schematic cross sectional view of a thin film magnetic head including a reading part and a writing part.

FIG. 1 is a schematic cross sectional view of a thin film magnetic head of one embodiment of the present invention. This thin film magnetic head 1 is a composite head including a reading element 10 and a writing element 120. Alternatively, the thin film magnetic head may be a head exclusively for reading that includes only the reading element 10.

Figure 2:
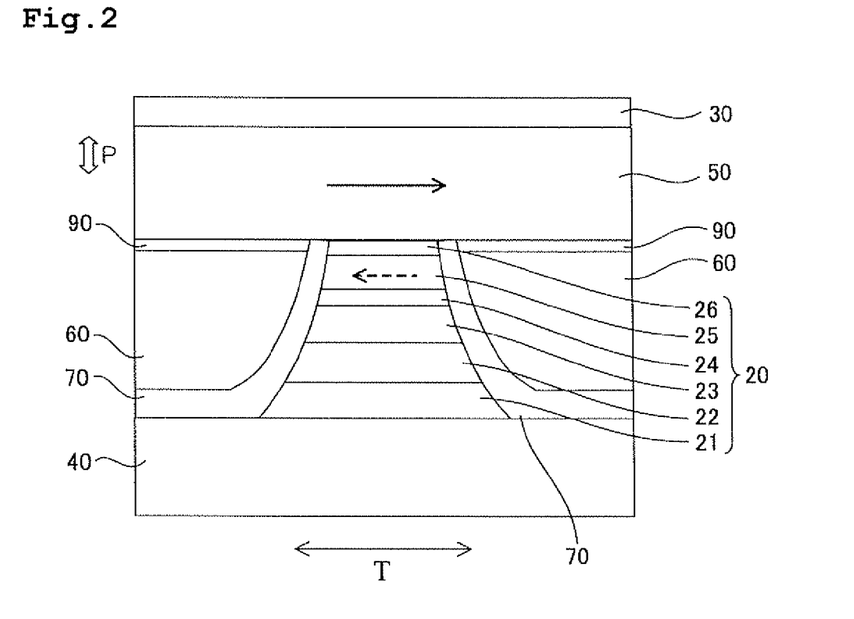
FIG. 2 is a schematic plan view of a reading part of a thin film magnetic head of the first embodiment, seen from an air bearing surface.

FIG. 2 is a schematic plan view of the reading element 10 of the thin film magnetic head 1 of the first embodiment, as seen from the 2A-2A direction in FIG. 1, or in other words, from an air bearing surface (ABS) 110. Herein, the ABS 110 is a surface of the thin film magnetic head 1 that faces a recording medium 262. A solid arrow in the figure indicates a magnetization direction of each layer, and a dotted arrow in the figure indicates a direction of bias that is applied to a free layer.

The reading element 10 has a spin-valve type magneto resistance effect (MR) film 20 where electrical resistance varies corresponding to an external magnetic field. The MR film 20 is positioned in a manner of facing the recording medium 262.

In direction P that is orthogonal to a film surface of the MR film 20, a pair of shields that are a lower shield 40 and an upper shield 50 are provided on both sides in a manner of sandwiching the MR film 20. A magnetic layer of NiFe, CoFe, NiCoFe, or FeSiAl etc., can be utilized for the lower shield 40 and the upper shield 50.

The lower shield 40 and the upper shield 50 function as electrodes where a sense current flows in the direction P orthogonal to the film surface of the MR film 20 when voltage is applied to the MR film 20. A magnetic field of the recording medium 262 at a position facing the MR film 20 varies as the recording medium 262 moves. When the MR film 20 detects the magnetic field variation as electrical resistance variation, the thin film magnetic head 1 reads magnetic information written in each domain of the recording medium 262.

Insulation films 70 are disposed between the MR film 20 and side shields 60 and between the lower shield 40 and the side shields 60. The insulation films 70 prevent the sense current from flowing from the side shields 60 to the MR film 20 and prevent the sense current from flowing from the side shields 60 to the lower shield 40. Furthermore, insulation films 90 are disposed between the side shields 60 and the upper shield 50. The insulation films 70 and 90 can be formed of $Al_2O_3$, etc.

The MR film 20 has a pinned layer 23 where a magnetization direction is pinned with respect to the external magnetic field, a free layer 25 where a magnetization direction varies corresponding to the external magnetic field, and a spacer 24 disposed between the pinned layer 23 and the free layer 25. As a specific example, the MR film 20 is disposed on the lower shield 40 having an approximately 1 μm thickness, and is preferably a lamination film that a buffer layer 21, a pinning layer 22, the pinned layer 23, the spacer 24, the free layer 25 and a magnetic coupling layer 26 are layered in this order.

The buffer layer 21 is disposed as a base of the pinning layer 22. A Ta layer, a NiCr layer, or a multilayer of Ta and Ru, etc. is utilized for the buffer layer 21. The pinning layer 22 is disposed to pin a magnetization direction of the pinned layer 23. An antiferromagnetic layer made of IrMn, PtMn, RuRdMn, FeMn, etc. is utilized for the pinning layer 22.

The pinned layer 23 is a ferromagnetic layer where a magnetization direction is pinned with respect to the external magnetic field. For example, a multilayer in which CoF, Ru, or CoFe, etc. are layered may be utilized for the pinned layer 23. The free layer 25 is a ferromagnetic layer where the magnetization direction varies corresponding to the external magnetic field. For example, a multilayer of CoFe and NiFe is utilized for the free layer 25.

The magnetization direction of the free layer 25 rotates corresponding to the external magnetic field, and forms an angle with respect to the magnetization direction of the pinned layer 23. In relation to the angle formed by the magnetization direction of the free layer 25 and the magnetization direction of the pinned layer 23, the electrical resistance of the MR film 20 varies. The thin film magnetic head 1 detects the electrical resistance variation and reads magnetic information of the recording medium.

The spacer 24 is disposed to maintain a distance between the free layer 25 and the pinned layer 23. Various materials, such as Cu, AlOx, or MgO, can be utilized for the spacer 24. The spacer 24 is preferably a nonmagnetic layer; however, it is not limited to the nonmagnetic layer.

The magnetic coupling layer 26 is disposed between the upper shield 50 and the free layer 25. The magnetic coupling layer 26 antiferromagnetically or ferromagnetically exchange-couples the upper shield 50 with the free layer 25. The upper shield 50 is disposed on the magnetic coupling layer 26. The magnetic coupling layer 26 is made of, for example, Ru, Rh, Cr, Cu, Ag, or the like. In view of thinning the film thickness of the MR film, the magnetic coupling layer 26 is preferably a single layer. In this case, a film thickness of the magnetic coupling layer 26 can be 1 nm or less.

An anisotropy providing layer 30 is disposed on the opposite side from the MR film 20 with respect to the upper shield 50. The anisotropy providing layer 30 provides exchange anisotropy to the upper shield 50 and magnetizes the upper shield 50 in a desired direction. For the anisotropy providing layer 30, an antiferromagnetic layer made of, such as IrMn, PtMn, RuRdMn, or FeMn, or a hard magnetic layer made of, such as CoPt, CoCrPt, or FePt, is utilized.

The free layer 25 is magnetically coupled with the upper shield 50 via the magnetic coupling layer 26. Therefore, the upper shield 50 applies bias to the free layer 25 via the magnetic coupling layer 26.

In the above-described thin film magnetic head, the anisotropy providing layer 30 that provides exchange anisotropy to the upper shield is disposed on an outer side of the pair of the shields. As a result, a gap between the pair of the shields 40 and 50 is decreased by an amount of the thickness of the anisotropy providing layer 30 (an antiferomagnetic layer or a hard magnetic layer). Also, since the anisotropy providing layer 30 having a sufficiently large film thickness is applicable, it becomes possible to generate sufficient bias.

It is preferred that side shields 60 are disposed on both sides of the MR film 20 in a track width direction T. Each of the side shields 60 includes a soft magnetic layer. The soft magnetic layer functions to absorb the external magnetic field. Therefore, the side shields 60 absorb magnetic fields applied to both sides of the MR film 20 in the track width direction T and achieve a side shield effect.

Figure 3:
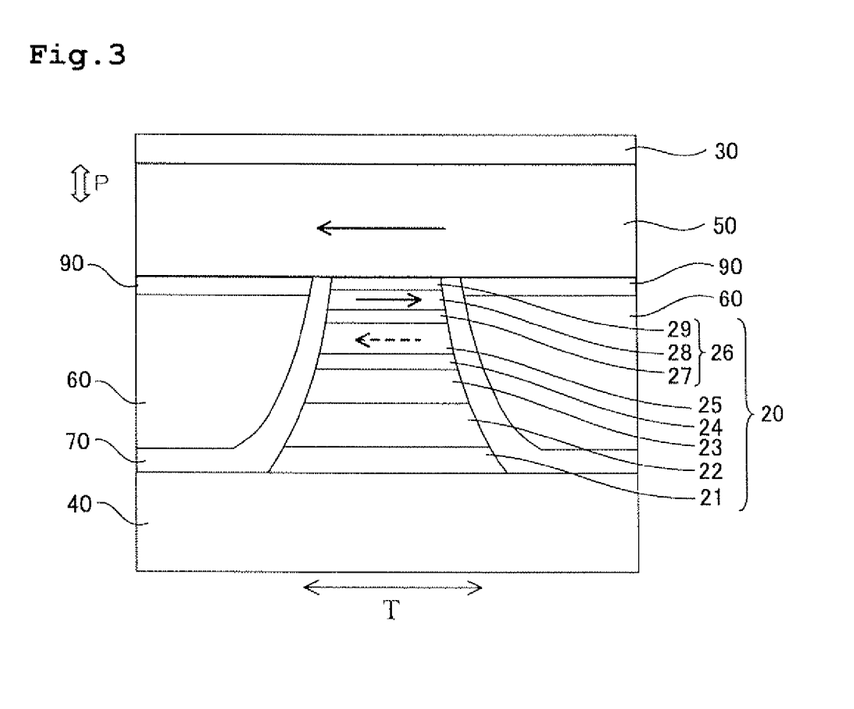
FIG. 3 is a schematic plan view of a reading part of a thin film magnetic head of the second embodiment, seen from an air bearing surface.

FIG. 3 is a schematic plan view of a reading element 10 of a thin film magnetic head 1 of the second embodiment, as seen from an air bearing surface. Each of the solid arrows in the figure indicates a magnetization direction of each layer, and a dotted arrow in the figure indicates a direction of bias that is applied to a free layer.

In the second embodiment, the magnetic coupling layer 26 includes nonmagnetic layers 27 and 29 that are disposed on both sides in a manner of sandwiching the soft magnetic layer 28. For example, NiFe, CoFe, NiCoFe, or a lamination film of these may be utilized for the soft magnetic layer 28. The nonmagnetic layers 27 and 29 are made of, for example, Ru, Rh, Cr, Cu, Ag, or the like. Even in such a configuration, a film thickness of the magnetic coupling layer 26 is less than approximately a few nm. Configurations other than the above described configuration are the same as the first embodiment.

The soft magnetic layer 28 antiferromagnetically or ferromagnetically exchange-couple to the free layer 25 via the first nonmagnetic layer 27. Similarly, the soft magnetic layer 28 antiferromagnetically or ferromagnetically exchange-couples to the upper shield 50 via the second nonmagnetic layer 29. As described above, the free layer 25 and the upper shield 50 are indirectly and magnetically coupled. Therefore, the upper shield 50 that is magnetized in the desired direction by the anisotropy providing layer 30 applies bias to the free layer 25 via the magnetic coupling layer 26.

Also in the second embodiment, the anisotropy providing layer 30 is arranged on the outer side of the pair of the shields. As the result, a gap between the pair of the shields 40 and 50 is decreased by an amount of the thickness of the anisotropy providing layer 30.

Figure 4:
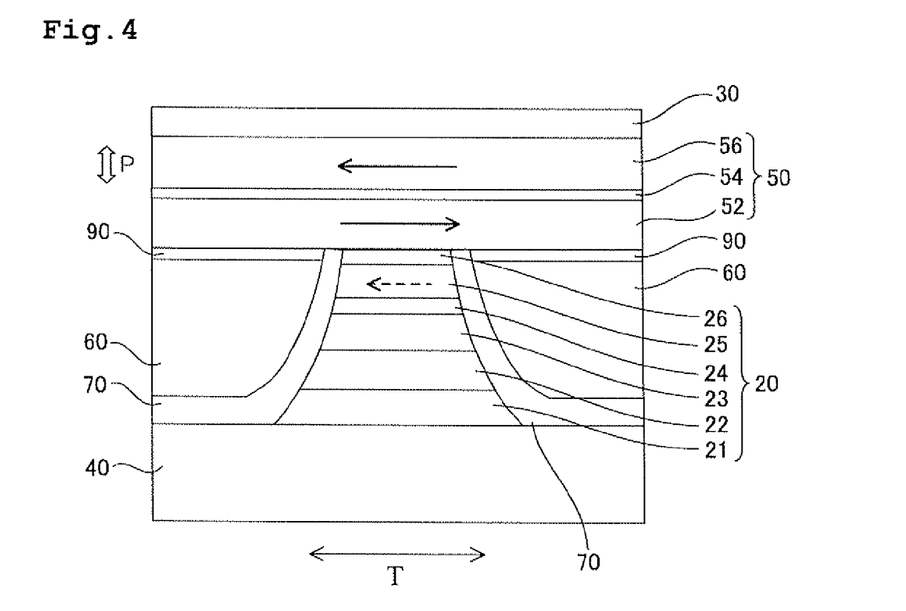
FIG. 4 is a schematic plan view of a reading part of a thin film magnetic head of the third embodiment, seen from an air bearing surface.

FIG. 4 is a schematic plan view of a reading element 10 of a thin film magnetic head 1 of the third embodiment, as seen from an air bearing surface. Each of the solid arrows in the figure indicates a magnetization direction of each layer, and a dotted arrow in the figure indicates a direction of bias that is applied to a free layer.

In the third embodiment, an upper shield 50 is configured with two soft magnetic layers 52 and 56 that are exchange-coupled via a magnetic coupling layer 54. The magnetic coupling layer 54 exchange-couples one soft magnetic layer 52 with the other soft magnetic layer 56. The magnetic coupling layer 54 is made with a nonmagnetic layer made of, for example, Ru, Rh, Cr, Cu, Ag or the like. The magnetic coupling layer 26 causes an exchange-coupling between the first soft magnetic layer 52 that is at a lower side of the upper shield 50 and the free layer 25. The other configurations except for this are the same as the first embodiment. Additionally, the upper shield 50 may also include a plurality of the magnetic coupling layer 54 and three or more soft magnetic layers.

In the third embodiment also, the anisotropy providing layer 30 is arranged on the outer side of the pair of the shields. As the result, a gap between the pair of the shields 40 and 50 is decreased by an amount of the thickness of the anisotropy providing layer 30.

Figure 5:
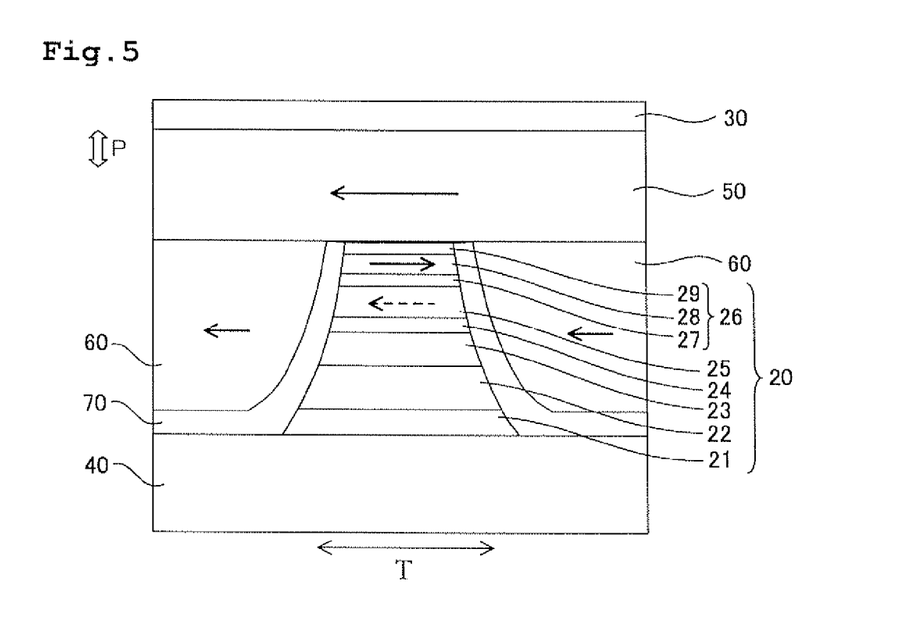
FIG. 5 is a schematic plan view of a reading part of a thin film magnetic head of the fourth embodiment, seen from an air bearing surface.

FIG. 5 is a schematic plan view of a reading element 10 of a thin film magnetic head 1 of the fourth embodiment, as seen from an air bearing surface. Each of the solid arrows in the figure indicates a magnetization direction of each layer, and a dotted arrow in the figure indicates a direction of bias that is applied to a free layer.

In the fourth embodiment, side shields 60 include soft magnetic layers that are magnetically connected with an upper shield 50. In the present specification, "magnetically connected" indicates either a state where both magnetic layers contact each other or a relationship where one magnetic layer is magnetized due to magnetic interaction when the other magnetic layer is magnetized. Herein, the magnetization generated in one magnetic layer and the magnetization generated in the other magnetic layer can be oriented either in the same direction or in opposite directions.

In the present embodiment, the side shields 60 are made only with soft magnetic layers that are magnetically connected with the upper shield 50. The soft magnetic layers contact the upper shield 50. The upper shield 50 can be made of either a material different from that of the side shields 60 or the same material. When the upper shield 50 is made of the same material as the side shields 60, the upper shield 50 and the side shields 60 can be configured in an integrated manner. The other configurations are same as the second embodiment.

The soft magnetic layers of the side shields 60 are magnetically connected with the upper shield 50, and the upper shield 50 is magnetized in the desired direction. Accordingly, the soft magnetic layers are also magnetized in the desired direction. By being magnetized in the desired direction, the soft magnetic layers obtain a function to apply a bias magnetic field to the MR film 20, especially to the free layer 25. At this time, it is preferred that a bias direction applied from the side shields 60 to the free layer 25 corresponds to a bias direction applied from the upper shield 50 to the free layer 25.

Also, since the soft magnetic layers of the side shields 60 are magnetically connected with the upper shield 50, a magnetic field applied to the soft magnetic layers is absorbed by the upper shield 50 via the soft magnetic layers. As described above, the magnetic field applied to both sides of the MR film 20 in the track width direction T is effectively absorbed by the side shields 60 and the upper shield 50. This maintains a function to shield the magnetic field applied to both sides of the MR film 20 in the track width direction T.

Also, since the magnetic field applied to both sides of the MR film 20 in the track width direction T is absorbed not only by the side shields 60 but also by the upper shield 50, magnetization direction variation of the side shields 60 is small. Therefore, the side shields 60 substantially apply the bias magnetic field to the free layer 25 even under a condition where the external magnetic field has been applied.

Figure 6:
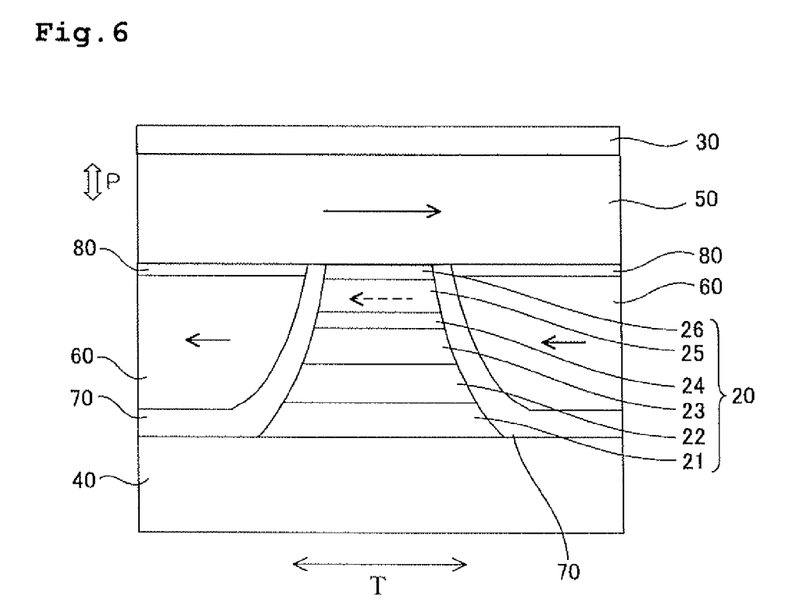
FIG. 6 is a schematic plan view of a reading part of a thin film magnetic head of the fifth embodiment, seen from an air bearing surface.

FIG. 6 is a schematic plan view of a reading element 10 of a thin film magnetic head 1 of the fifth embodiment, as seen from an air bearing surface. Each of the solid arrows in the figure indicates a magnetization direction of each layer, and a dotted arrow in the figure indicates a direction of bias that is applied to a free layer.

In the fifth embodiment, side shields 60 including soft magnetic layers exchange-couple to an upper shield 50 via a magnetic coupling layer 80. All other configurations are the same as the first embodiment. The magnetic coupling layer 80 is made with a nonmagnetic layer made of, for example, Ru, Rh, Cr, Cu, Ag or the like.

The anisotropy providing layer 30 provides exchange anisotropy to the upper shield 50 and magnetizes the upper shield 50 in the desired direction. Since the side shield 60 antiferromagnetically or ferromagnetically exchange-couples to the upper shield 50, the side shield 60 is also magnetized in the desired direction. As a result, the side shields 60 obtain a function to apply the bias magnetic field to the free layer of the MR film 20. At this time, it is preferred that a bias direction applied from the side shields 60 to the free layer 25 corresponds to a bias direction applied from the upper shield 50 to the free layer 25.

Figure 7:
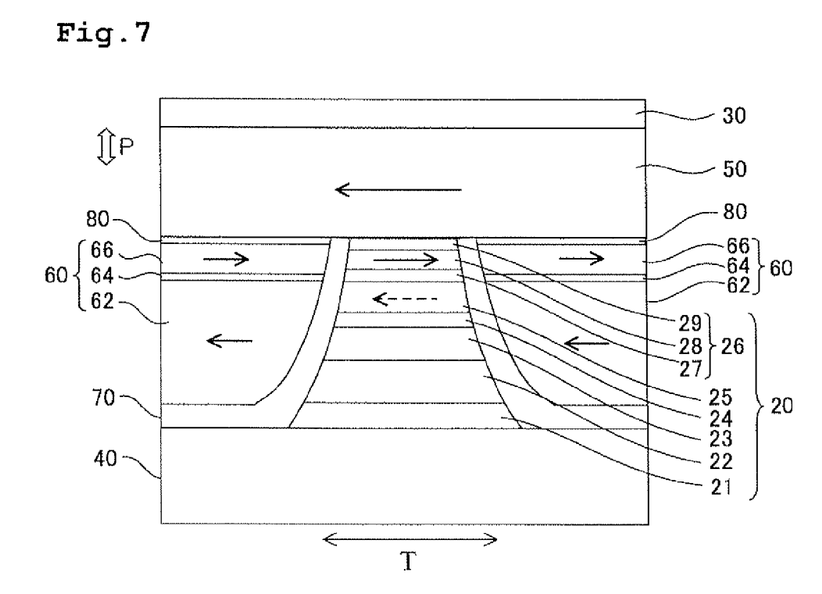
FIG. 7 is a schematic plan view of a reading part of a thin film magnetic head of the sixth embodiment, seen from an air bearing surface.

FIG. 7 is a schematic plan view of a reading element 10 of a thin film magnetic head 1 of the sixth embodiment, as seen from an air bearing surface. Each of the solid arrows in the figure indicates a magnetization direction of each layer, and a dotted arrow in the figure indicates a direction of bias that is applied to a free layer.

In the sixth embodiment, side shields 60 including soft magnetic layers include a plurality of soft magnetic layers 62 and 66 that are exchange-coupled to each other via magnetic coupling layers 64. The soft magnetic layers 66 that are at the upper side of the side shields 60 exchange-couple to an upper shield 50 via a magnetic coupling layer 80. The magnetic coupling layers 64 and 80 are made with nonmagnetic layers such as, for example, Ru, Rh, Cr, Cu, Ag, or the like. All other configurations are the same as the fourth embodiment.

Also, in the present embodiment, since the side shields 60 are magnetized in the desired direction, the side shields 60 obtain the function to apply the bias magnetic field to the free layer of the MR film 20. Also, since the side shields 60 are magnetically connected with the upper shield 50, as in the first embodiment, the function is maintained of shielding the magnetic field applied to both sides of the MR film 20 in the track width direction T.

Figure 8:
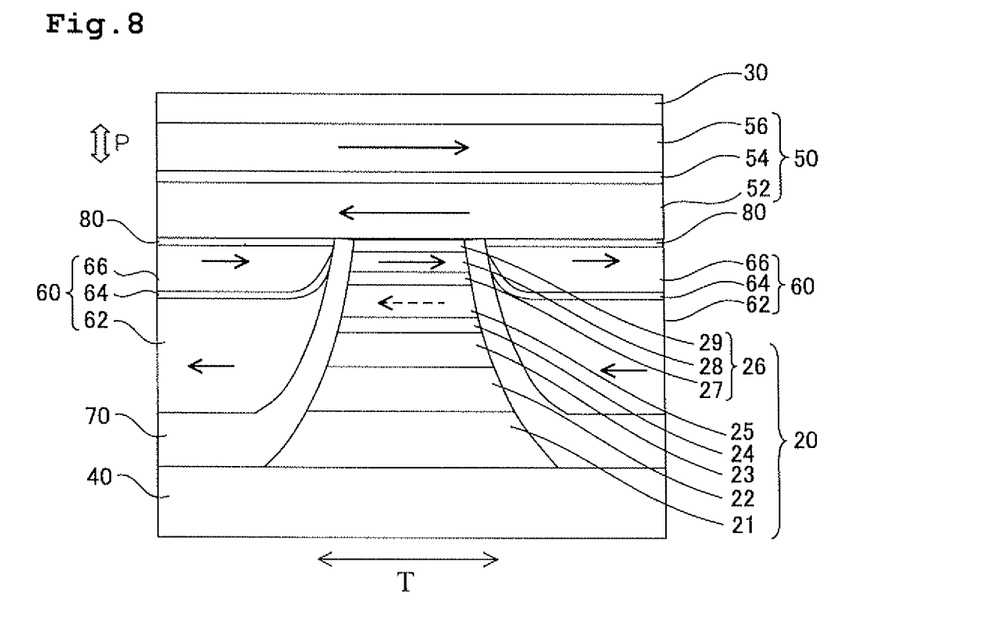
FIG. 8 is a schematic plan view of a reading part of a thin film magnetic head of the seventh embodiment, seen from an air bearing surface.

FIG. 8 is a schematic plan view of a reading element 10 of a thin film magnetic head 1 of the seventh embodiment, as seen from an air bearing surface. Each of the solid arrows in the figure indicates a magnetization direction of each layer, and a dotted arrow in the figure indicates a direction of bias that is applied to the free layer.

In the seventh embodiment, side shields 60 including soft magnetic layers include a plurality of soft magnetic layers 62 and 66 that are exchange-coupled to each other via magnetic coupling layers 64. The soft magnetic layers 62, which are at the bottom among the plurality of the soft magnetic layers 62 and 66 in the lamination direction P, protrude along surfaces of the side shields 60 that face the MR film 20. The soft magnetic layers 62, which are the bottom layers, preferably protrude up to the position of the free layer 25 of the MR film 20. All other configurations are the same as the sixth embodiment.

In the present embodiment, since the soft magnetic layers 62 protrude, which are the bottommost layers of the side shields 60, the soft magnetic layers 62 primarily apply the bias magnetic field to the MR film 20. Therefore, even if the pluralities of the soft magnetic layers 62 and 66 that configure the side shields 60 are magnetized in different directions, it is possible to apply the bias magnetic field efficiently to the MR film 20.

In order to more efficiently apply the bias magnetic field to the MR film 20, the soft magnetic layers 62, which are the bottommost layers, preferably have larger film thicknesses than the other soft magnetic layer 66.

Also, since the side shields 60 are magnetically connected with the upper shield 50, in the same manner as the fourth and fifth embodiments, the function is maintained to shield the magnetic field applied to the both sides of the MR film 20 in the track width direction T.

Such side shields 60 are easily manufactured by laminating the MR film 20 on the lower shield 40 first, then by forming the insulation films 70 and the side shields 60 by sputtering or the like. This is because, as illustrated in FIG. 8, at least a slope is formed when the side shields 60 are vapor deposited on uneven portions by sputtering or the like.

Additionally, in the fourth through seventh embodiments as well, in the same manner as the first embodiment, the upper shield 50 applies bias to the free layer 25 via the magnetic coupling layer 26. Also, the gap between the pair of the shields 40 and 50 is decreased by the amount of the thickness of the anisotropy providing layer 30 (an antiferromagnetic layer or a hard magnetic layer). That is also the same as the first embodiment.

The present invention is not limited to the above-described embodiments, and it is possible to modify the present invention with an embodiment providing a reading element in which a number of the above-described embodiments are combined to the extent possible.

In the above-described embodiments, the free layer 25 magnetically couples to the upper shield 50. However, the free layer 25 may magnetically couple to the lower shield 40. One example of such a reading element 10 is illustrated in FIG. 9.

Figure 9:
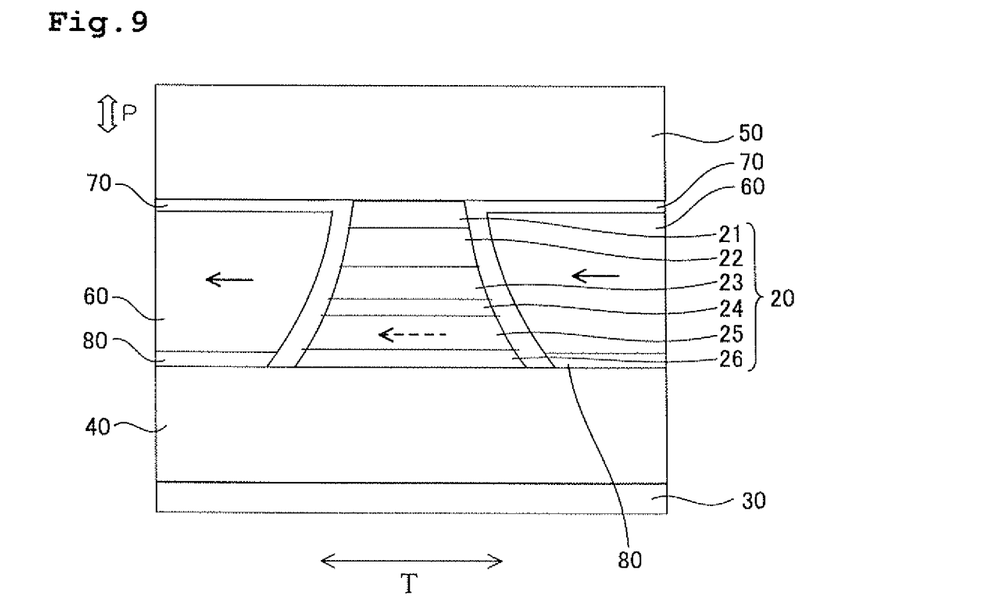
FIG. 9 is a schematic plan view of a reading part of a thin film magnetic head of the eighth embodiment, seen from an air bearing surface.

FIG. 9 illustrates the reading element 10 of the thin film magnetic head of the eighth embodiment. Each of the solid arrows in the figure indicates a magnetization direction of each layer, and a dotted arrow in the figure indicates a direction of bias that is applied to a free layer.

In the eighth embodiment, an MR film 20 is formed on a lower shield 40 having an approximately 1 μm thickness, and is preferably a lamination film in which a magnetic coupling layer 26, a free layer 25, a spacer 24, a pinned layer 23, a pinning layer 22, and a buffer layer 21 are layered in this order. In other words, each of the layers is layered in the inverse order from the MR film explained in the first embodiment.

Insulation layers 70 are disposed between the MR film 20 and side shields 60 and between an upper shield 50 and the side shields 60. The magnetic coupling layer 26 is disposed between the lower shield 40 and the free layer 25. The magnetic coupling layer 26 antiferromagnetically or ferromagnetically exchange-couples the lower shield 40 with the free layer 25.

An anisotropy providing layer 30 is disposed on the opposite side from the MR film 20 with respect to the lower shield 40. The anisotropy providing layer 30 provides exchange anisotropy to the lower shield 40 and magnetizes the lower shield 40 in the desired direction. In other words, the anisotropy providing layer 30 provides the exchange anisotropy to a shield (the lower shield 40 in the case of FIG. 9), which is disposed closer to the free layer 25 than to the pinned layer 23, of the pair of the shields 40 and 50, and magnetizes the shield in the desired direction.

The free layer 25 is magnetically coupled with the lower shield 40 via the magnetic coupling layer 26. Therefore, the lower shield 40 applies the bias to the free layer 25 via the magnetic coupling layer 26.

In the above-described thin film magnetic head, the anisotropy providing layer 30 that provides the exchange anisotropy to the lower shield 40 is positioned on an outer side of the pair of the shields. As the result, a gap between the pair of the shields 40 and 50 is decreased by the amount of the thickness of the anisotropy providing layer 30 (an antiferromagnetic layer or a hard magnetic layer). Also, since the anisotropy providing layer 30 having a sufficiently large film thickness is applicable, it becomes possible to generate sufficient bias.

Additionally, for the side shields 60 disposed on the both sides of the MR film 20 in the track width direction T, it is possible to utilize any of the configurations and shapes that are identical to the described embodiments above.

Next, referring to FIG. 1, a configuration of a writing element 120 will be explained in detail. The writing element 120 is formed above the reading element 10 via an interelement shield 126 formed by a sputtering or the like. The writing element 120 has a configuration for so-called perpendicular magnetic recording. A magnetic pole layer for writing is configured with a main pole layer 121 and an auxiliary pole layer 122. These magnetic pole layers 121 and 122 are formed by a frame plating method or the like. The main pole layer 121 is made of FeCo, and is exposed in a direction substantially orthogonal to the ABS 110 on the ABS 110. In the surrounding area of the main pole layer 121, coil layers 123 extended over a gap layer 124 made of an insulation material are wound, and magnetic flux is induced to the main pole layer 121 by the coil layers 123 or the like. The coil layers 123 are made by a frame plating method. The magnetic flux is induced to an inside of the main pole layer 121 and is extended toward the recording medium 262 from the ABS 110. The main pole layer 121 is tapered not only in the film surface orthogonal direction P but also in the track width direction T (a sheet surface perpendicular direction of FIG. 1) in the vicinity of the ABS 110, and generates a minute and strong writing magnetic field that corresponds to high recording density.

The auxiliary pole layer 122 is a magnetic layer that magnetically couples to the main pole layer 121. The auxiliary pole layer 122 is a magnetic pole layer that is made of an alloy of any two or three of Ni, Fe or Co, and that has a film thickness of approximately 0.01 μm-approximately 0.5 μm. The auxiliary pole layer 122 is branched from the main pole layer 121 and faces the main pole layer 121 via the gap layer 124 and a coil insulation layer 125 on the ABS 110 side. An edge part of the auxiliary pole layer 122 on the ABS 110 side forms a trailing shield part whose layer cross section is wider than the other parts of the auxiliary pole layer 122. The placement of such an auxiliary pole layer 122 causes an even steeper gradient in the magnetic field between the auxiliary pole layer 122 and the main layer 121 in the vicinity of the ABS 110. As a result, signal output jitter becomes small and an error rate during a reading process becomes small.

Figure 10:
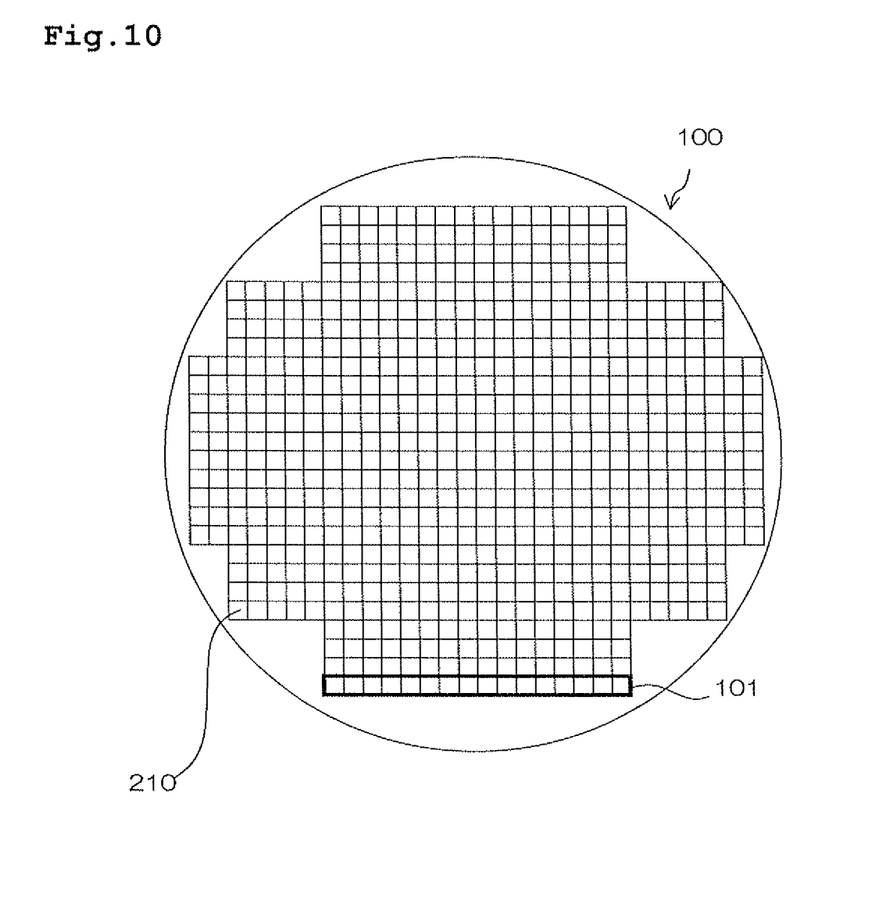
FIG. 10 is a plan view of a wafer in relation to the manufacture of the thin film magnetic head of the present invention.

Next, a wafer to be utilized for manufacturing the above-described thin film magnetic head will be explained. Referring to FIG. 10, at least a lamination film forming the above-described thin film magnetic heads is formed on a wafer 100. The wafer 100 is divided into a plurality of bars 101, which are working units for the polishing process of the ABS. The bar 101 is further cut after the polishing process and is divided into sliders 210 including the thin film magnetic head. Margins for cutting (not illustrated) that are for cutting the wafer 100 into the bar 101 and for cutting the bar 101 into the slider 210 are formed in the wafer 100.

Figure 11:
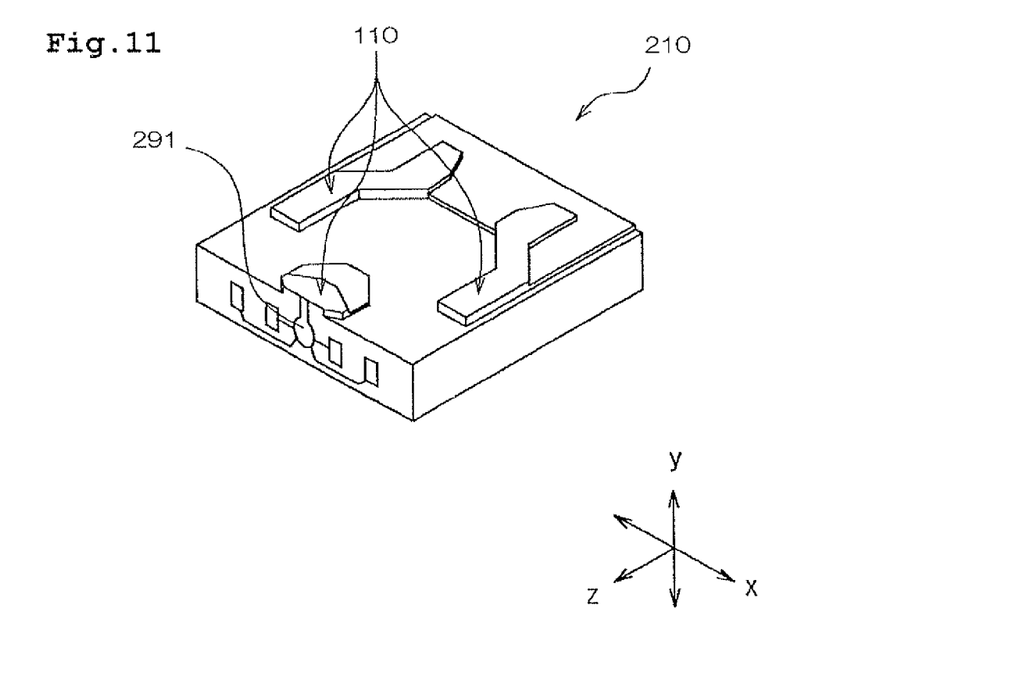
FIG. 11 is a perspective view of a slider of the present invention.

Referring to FIG. 11, the slider 210 has a substantially hexahedral shape, and one surface of the six outer surfaces is the ABS 110 facing a hard disk.

Figure 12:
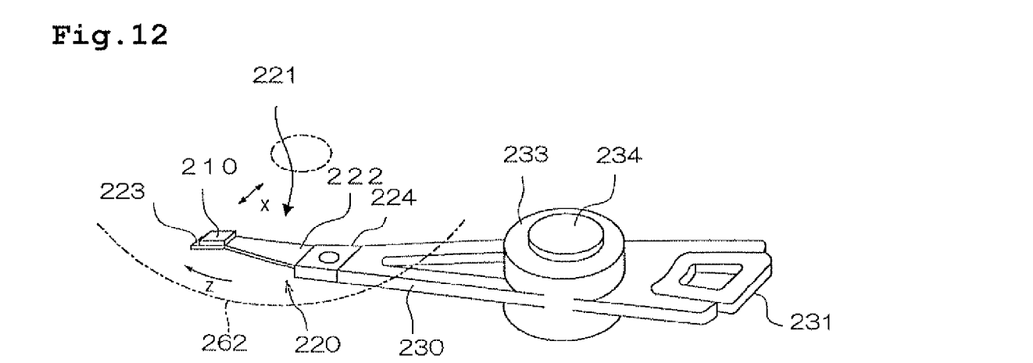
FIG. 12 is a perspective view of a head arm assembly including a head gimbal assembly in which the slider of the present invention is incorporated.

Referring to FIG. 12, a head gimbal assembly 220 has the slider 210 and a suspension 221 elastically supporting the slider 210. The suspension 221 has a load beam 222, a flexure 223, and a base plate 224. The load beam 222 is formed in a plate spring shape and made of stainless steel. The flexure 223 is arranged in one edge part of the load beam 222. The base plate 224 is arranged in the other edge part of the load beam 222. The flexure 223 is joined to the slider 210 to give the slider 210 suitable flexibility. At the part of the flexure 223 to which the slider 210 is attached, a gimbal part is disposed to maintain the slider 210 in an appropriate orientation.

The slider 210 is arranged in the hard disk device such that the slider 210 faces the hard disk, which is a disk-shaped recording medium that is rotatably driven. When the hard disk rotates in the z-direction of FIG. 12, air flow passing between the hard disk and the slider 210 generates a downward lifting force in the y-direction to the slider 210. The slider 210 flies from the surface of the hard disk due to the lifting force. In the vicinity of the edge part of the slider 210 (edge part in bottom left of FIG. 11) at the air flow exit side, the thin film magnetic head 291 is formed.

A part in which the head gimbal assembly 220 is mounted on an arm 230 is referred to as a head arm assembly 221. The arm 230 moves the slider 210 in the track crossing direction x of the hard disk 262. One edge of the arm 230 is mounted on the base plate 224. On the other edge of the arm 230, a coil 231 is mounted, which forms one part of a voice coil motor. A bearing part 233 is arranged in the middle section of the arm 230. The arm 230 is rotatably supported by a shaft 234 mounted on the bearing part 233. The arm 230 and the voice coil motor for driving the arm 230 configure an actuator.

Figure 13:
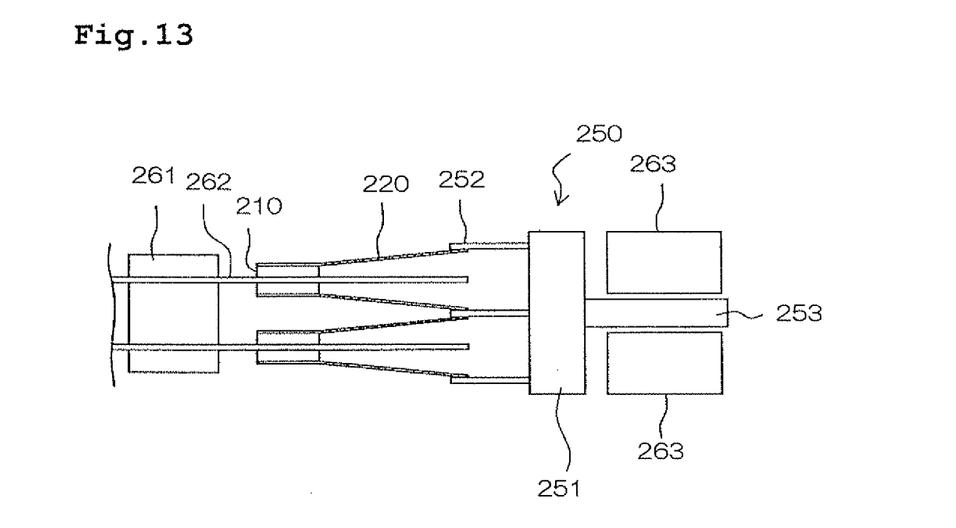
FIG. 13 is a side view of a head arm assembly in which the slider of the present invention is incorporated.
Figure 14:
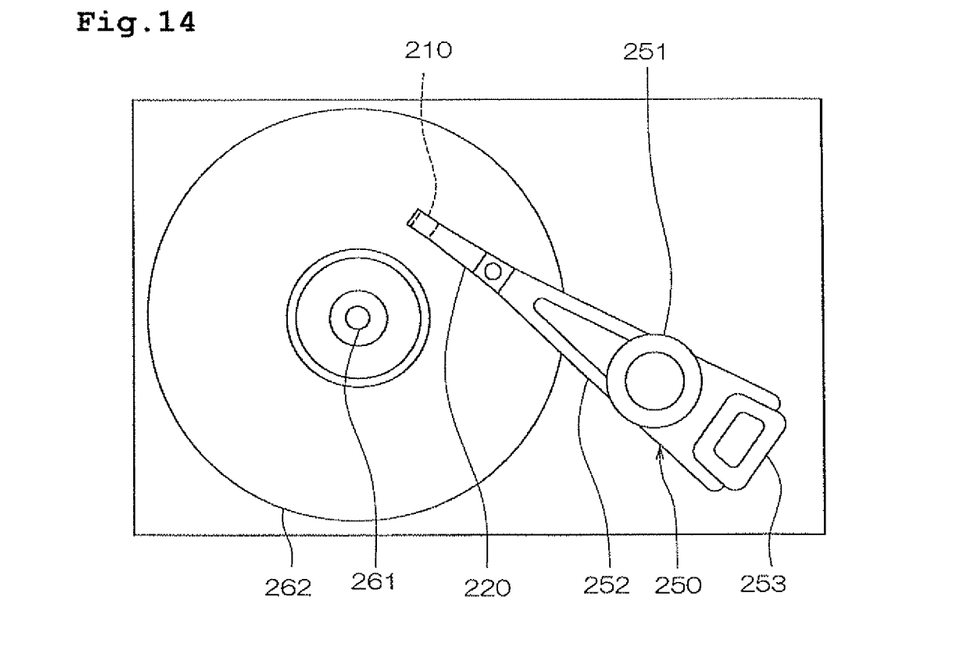
FIG. 14 is a plan view of a hard disk device in which the slider of the present invention is incorporated.

Next, referring to FIGS. 13 and 14, a head stack assembly in which the above-described slider is integrated and the hard disk device will be explained. The term "head stack assembly" refers to a component in which the head gimbal assemblies 220 are respectively mounted on a plurality of the arms provided with a carriage. FIG. 13 is a side view of the head stack assembly. FIG. 14 is a plan view of the hard disk device. The head stack assembly 250 includes a carriage 251 having a plurality of arms 230. On each of the arms 252, the head gimbal assembly 220 is mounted so that the head gimbal assemblies 220 align with an interval in the vertical direction. At the opposite side of the arm 252 from the carriage 251, the coil 253 is mounted to be a part of the voice coil motor. The voice coil motor has permanent magnets 263 arranged sandwiching the coil 231 and facing each other.

Referring to FIG. 14, the head stack assembly 250 is integrated in the hard disk device. The hard disk device has multiple hard disks 262 mounted on a spindle motor 261. On each of the hard disks 262, two sliders 210 are arranged in a manner of sandwiching the hard disk 262 and facing each other. The head stack assembly 250 except for the slider 210 and an actuator, corresponding to a positioning device of the present invention, not only support the slider 210 but also position the slider 210 with respect to the hard disk 262. The slider 210 is moved in the track crossing direction of the hard disk 262 by the actuator, and is positioned with respect to the hard disk 262. The thin film magnetic head 1 included in the slider 210 records the information to the hard disk 262 by the recording head, and reproduces the information recorded on the hard disk 262 by the reproducing head.

A description of the preferred embodiment according to the present invention was given above in detail. However, it should be appreciated that a wide variety of alterations and modifications are possible as far as they do not depart from the spirit and scope of the attached claims.

What is claimed is:

1. A thin film magnetic head, comprising:
   a magneto resistance effect (MR) film that includes a pinned layer of which a magnetization direction is pinned with respect to an external magnetic field, a free layer of which a magnetization direction varies corresponding to the external magnetic field, and a spacer that is disposed between the pinned layer and the free layer;
   a pair of shields that are disposed on both sides in a manner of sandwiching the MR film in a direction orthogonal to a film surface of the MR film; and
   an anisotropy providing layer that provides anisotropy to a first shield, which is disposed on a free layer side of the pair of the shields, so that the first shield is magnetized in a desired direction, and that is disposed on an opposite side from the MR film with respect to the first shield, wherein
   the MR film includes a magnetic coupling layer that is disposed between the first shield and the free layer and that magnetically couples the first shield with the free layer.

2. The thin film magnetic head according to claim 1, wherein
   the pair of the shields are electrodes that apply voltage to the MR film so that sense current flows in a direction orthogonal to the film surface of the MR film.

3. The thin film magnetic head according to claim 1, wherein
   the anisotropy providing layer is an antiferromagnetic layer.

4. The thin film magnetic head according to claim 1, wherein
   the anisotropy providing layer is a hard magnetic layer.

5. The thin film magnetic head according to claim 1, wherein
   the magnetic coupling layer is made with a single nonmagnetic layer.

6. The thin film magnetic head according to claim 1, wherein
   the magnetic coupling layer is made with a hard magnetic layer and a pair of nonmagnetic layers that are disposed on both sides in a manner of sandwiching the hard magnetic layer, and each of the nonmagnetic layers exchange-couples to the hard magnetic layer.

7. The thin film magnetic head according to claim 1, further comprising:
   side shields that include soft magnetic layers and that are disposed on both sides of the MR film in a track width direction.

8. The thin film magnetic head according to claim 7, wherein
   the soft magnetic layers of the side shields are magnetically connected with the first shield.

9. The thin film magnetic head according to claim 8, wherein
   each of the soft magnetic layers of the side shields exchange-couples to the first shield via a nonmagnetic layer.

10. The thin film magnetic head according to claim 7, wherein
    the side shields include a plurality of soft magnetic layers that are exchange-coupled to each other via nonmagnetic layers.

11. The thin film magnetic head according to claim 10, wherein the soft magnetic layers, which are at bottom among the plurality of the soft magnetic layers in a lamination direction, protrude along surfaces of the side shields that face the MR film.

12. The thin film magnetic head according to claim 10, wherein
    the soft magnetic layers, which are at the bottom among the plurality of the soft magnetic layers, have larger film thicknesses than the other soft magnetic layers.

13. The thin film magnetic head according to claim 7, wherein
    the side shields are made only with the soft magnetic layers that are magnetically connected with the first shield and that contact the first shield.

14. The thin film magnetic head according to claim 7, wherein
    the side shields are made only with the soft magnetic layers that are magnetically connected with the first shield, and
    the first shield is made of the same material as the soft magnetic layer and is formed in an integrated manner with the side shields.

15. The thin film magnetic head according to claim 1, wherein
    the first shield includes a plurality of soft magnetic layers that are exchange-coupled via a non magnetic layer.

16. A slider that comprises the thin film magnetic head according to claim 1.

17. A head gimbal assembly, comprising:
    the slider according to claim 16; and
    a suspension that elastically supports the slider.

18. A hard disk device, comprising:
    the slider according to claim 16; and
    a device that supports the slider and that positions the slider with respect to a recording medium.

19. A wafer in which a lamination film including the thin film magnetic head according to claim 1 is formed.

* * * * *